United States Patent [19]

Florentino et al.

[11] Patent Number: 5,408,675

[45] Date of Patent: Apr. 18, 1995

[54] PROGRAMMABLE RANK ORDER FILTER

[75] Inventors: Christopher Florentino, Malverne; William M. Vojir, Seaford, both of N.Y.

[73] Assignee: Grumman Aerospace Corporation, Bethpage, N.Y.

[21] Appl. No.: 996,133

[22] Filed: Dec. 23, 1992

[51] Int. Cl.[6] .............................................. G06F 7/00
[52] U.S. Cl. .............................. 395/800; 364/DIG. 2; 364/724.01; 364/572
[58] Field of Search ................ 395/800; 364/825, 572, 364/724.01, DIG. 2; 382/34, 36

[56] References Cited

U.S. PATENT DOCUMENTS 4,456,968  6/1984  Carter et al. ........................ 364/900

OTHER PUBLICATIONS

M. Skolnik, "Automatic Detecting, Tracking and Sensor Integration", *Radar Handbook*, pp. 8.12–8.15 and 8.18–8.21 (1990).

*Primary Examiner*—Alyssa H. Bowler
*Assistant Examiner*—Valerie Darbe
*Attorney, Agent, or Firm*—Bacon & Thomas

[57] ABSTRACT

A hardware implementation of a rank order filter includes inputs for inputting a window parameter or window size signal and a target rank signal, thereby permitting programming of the rank order filter to perform rank order filtering within any specified window and relative to any desired target rank.

9 Claims, 11 Drawing Sheets

Programmable Rank Order Filter

FIG. 3 Rankfile Manager

Control Logic

Counters

| First Input | Last Input | Previous Last Input | Previous State of Gate Controller | Gate Controller Output |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 1 |
| 0 | 1 | 0 | 0 | 0 |
| 0 | 1 | 0 | 1 | 0 |
| 0 | 1 | 1 | 0 | 1 |
| 0 | 1 | 1 | 1 | 1 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

FIG. 6

Truth Table for Input Gate Control

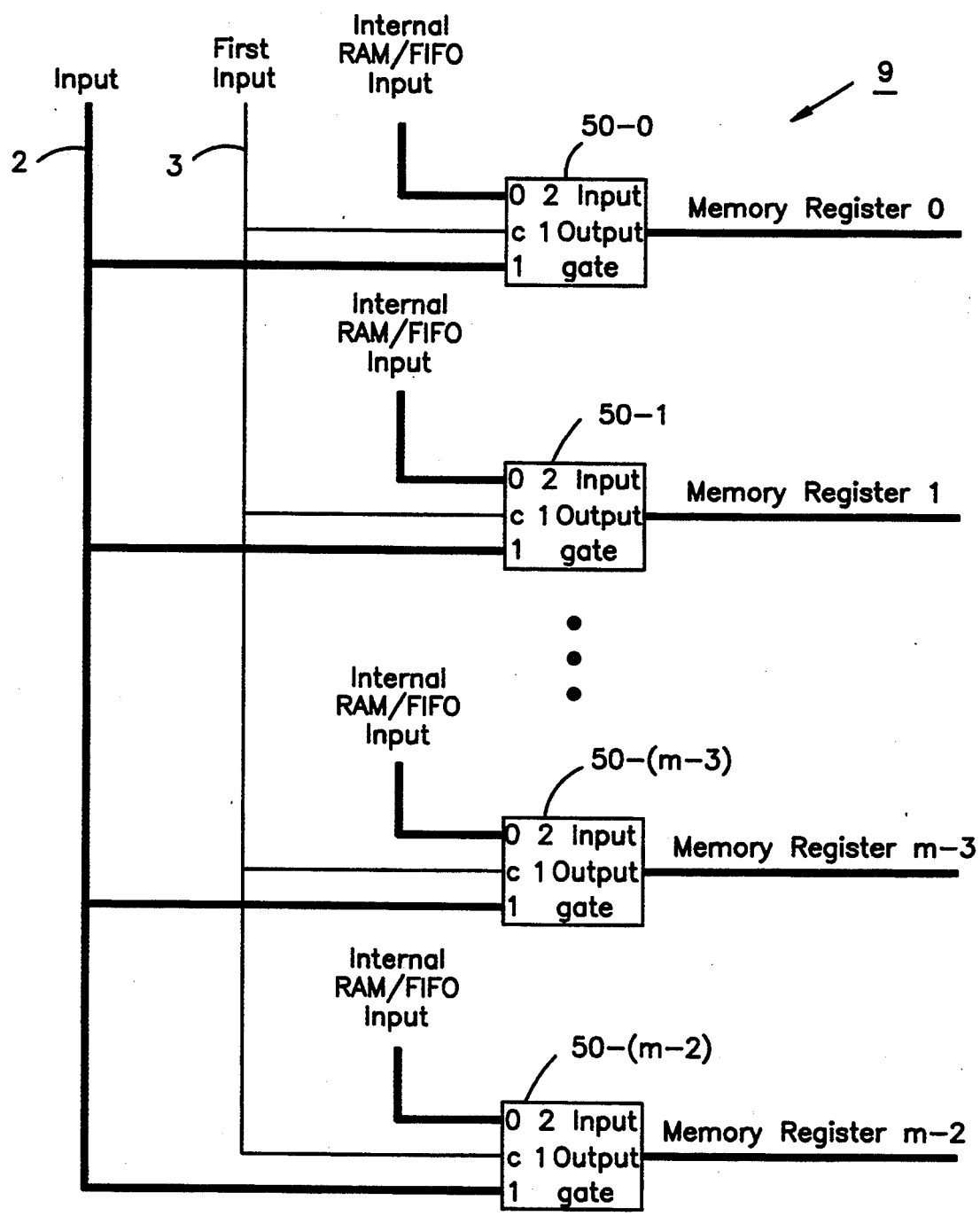
FIG. 7   Direct RAM/FIFO Input

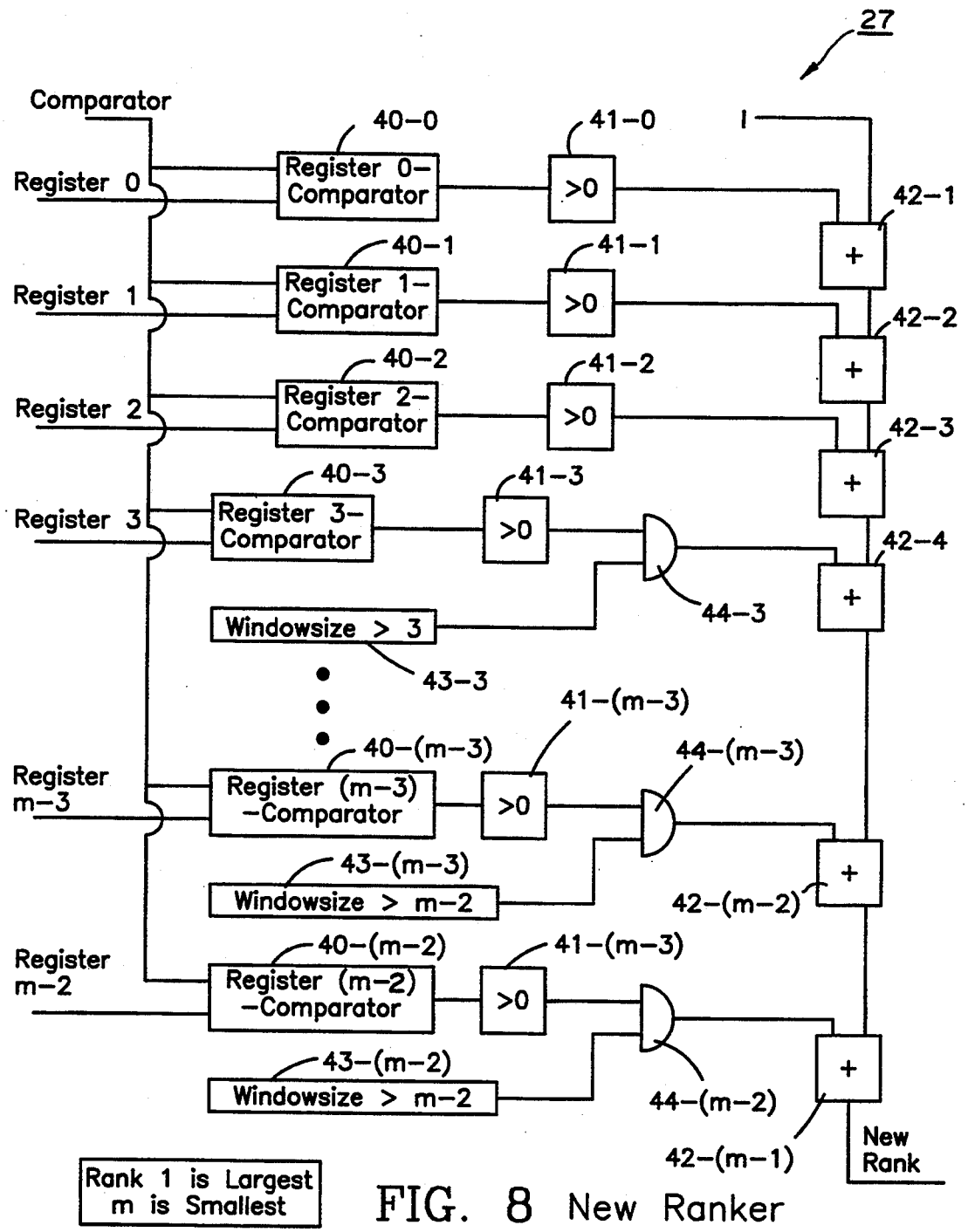
FIG. 8 New Ranker

Blankrank Finder

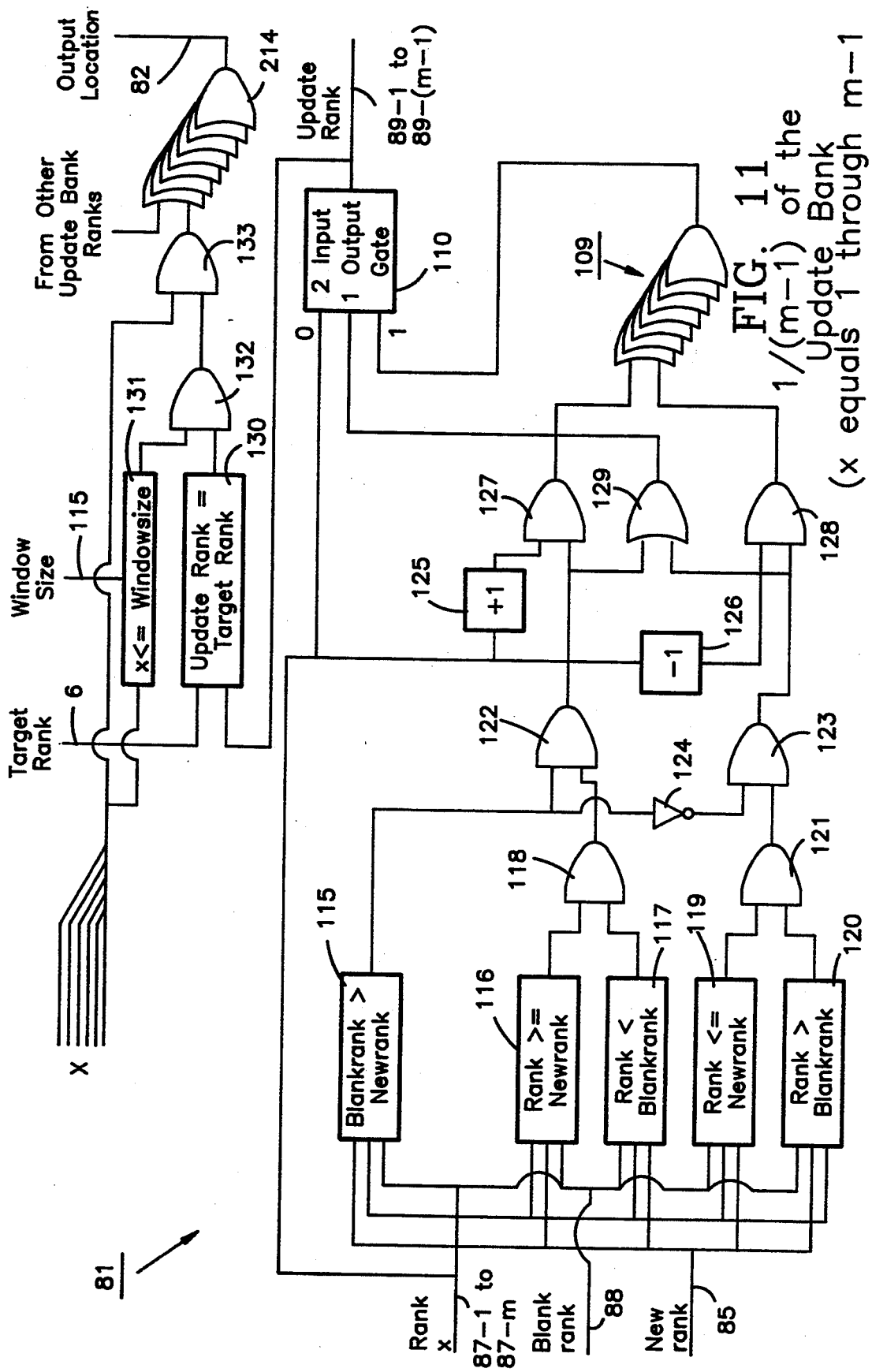

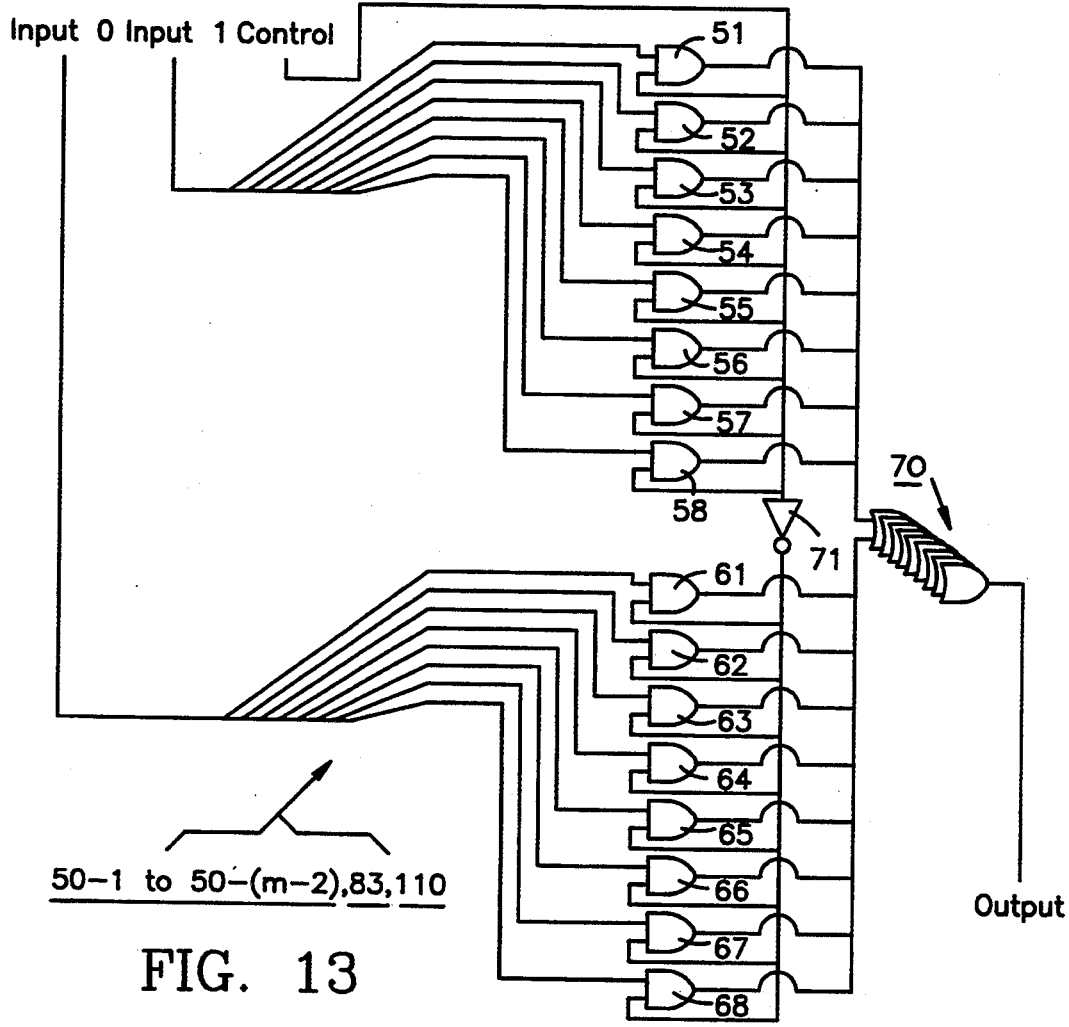

PROGRAMMABLE RANK ORDER FILTER

BACKGROUND OF THE INVENTION

1. Field of the Invention

This invention relates to a programmable rank order filter implementation suitable for use in real-time signal and image processing applications.

2. Description of Related Art

The rank order filter is a filter that orders n samples of an input and replaces the smallest to the largest samples with ranks ranging, respectively, from zero to $n-1$.

The simplest application is in a detector which operates under the hypothesis that all of the samples are independent samples from an unknown density function, the test sample having an equal probability of taking on any of the n values. This type of rank detector is constructed by comparing the rank with a threshold or target rank and generating a 1 if the rank is larger, a 0 otherwise. The 0's and 1's are summed in a moving window. For the more general case of correlated time samples, the detector is often divided into three parts, a ranker, an integrator, and a threshold "decision processor". The decision processor estimates the standard deviation of the correlated sample with a mean deviant estimator.

Depending on the target rank, rank order filters include as a subclass minimum, maximum, and median filters, and thus this type of filter has a wide variety of uses. Used as a median filter, for example, the rank order filter is able to eliminate Gaussian interference while preserving sharp edges of an input pulse, and thus is especially useful in image processing. The rank order filter can also be used as a maximum or minimum filter by choosing a target rank which is equal, respectively, either to one or to the window size.

The two most common approaches for implementing rank order filters are to use either dedicated hard-wired circuitry or software., Both approaches have disadvantages, however. Hardware implementations, while possessing the speed necessary for real time applications, lack flexibility, while software implementations, which are generally more flexible, are significantly slower than hardware implementations. The inventive programmable rank order filter, on the other hand, as described below, is a hardware implementation which has been designed for both maximum speed and flexibility.

SUMMARY OF THE INVENTION

It is a principal objective of the invention to provide a rank order filter hardware implementation that is flexible and at the same time processes data at a very high speed, and therefore is suitable for a wide variety of signal and image processing applications.

This objective is achieved by providing a programmable rank order filter (PROF) circuit which performs rank order filtering on a sequential data set and in which the target rank n is completely selectable to provide an nth rank filter, special cases of which include a maximum, minimum, or median filter.

The objective is further achieved by providing a PROF circuit which performs rank order filtering on a sequential data set and in which the window size can be input in addition to the target rank.

The inventive PROF circuit requires only $S+wp+1$ clock cycles per filtering pass, where S is the length of the data string and wp stands for "window parameter." The window size is derived from the window parameter and equals twice the window parameter plus one. Since a 512 word data string can generally be filtered to its root form in three passes, the invention is capable of achieving real time rank order filtering of a linear signal with a single PROF, processing at clock speeds of 20 MHz or greater. Multiple PROFs can be used in sequence to perform multiple passes with minimum latency.

The principal objective of the invention is further achieved by providing a PROF which is implemented at either the chip or board level using the following basic functional circuit elements:

1. A combination RAM and FIFO.
2. A direct RAM/FIFO input block.
3. An initializer.
4. An update bank.
5. A control logic block,
6. A new ranker.
7. A blankrank finder.

Each of these basic elements will be described in greater detail below in connection with an exemplary preferred embodiment of the invention.

BRIEF DESCRIPTION OF THE DRAWINGS

FIG. 6 is a truth table for the logic diagram of the input gate controller shown in FIG. 4.

FIG. 7 is a circuit diagram of the direct RAM/FIFO input shown in FIG. 2.

FIG. 8 is a circuit diagram of the new ranker shown in FIG. 2.

FIG. 11 is a schematic circuit diagram illustrating the manner in which ranks 1 through m-2 are updated by the update bank shown in FIG. 2.

FIG. 12 is a table illustrating the operation of the circuit shown in FIG. 11.

FIG. 13 is a logic diagram of a two input/one output 8-bit gate for use in the direct RAM/FIFO input shown in FIG. 7, the junction gate shown in FIG. 9b, and the update bank circuit shown in FIG. 11.

DETAILED DESCRIPTION OF THE PREFERRED EMBODIMENTS

Figure 1:
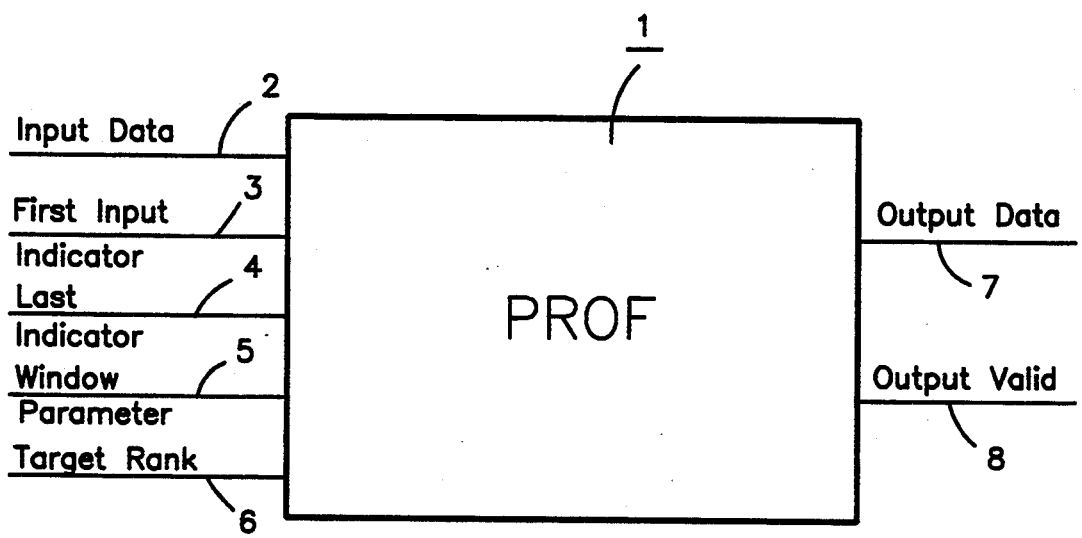
FIG. 1 is a block diagram illustrating the input/output definitions of an exemplary programmable rank order filter constructed in accordance with the principles of a preferred embodiment of the invention.

As shown in FIG. 1, an exemplary PROF 1 constructed in accordance with the principals of a preferred embodiment of the invention includes five digital inputs 2-6, and produces two digital outputs 7 and 8. The inputs and outputs are as follows:

The first input 2 is for the data to be filtered. The input data may be of infinite or finite length, depending on the application, so long as it is linear data. For example, one possible use for the inventive filter is in a radar tracking system, for the purpose of removing random false alarm and unwanted targets, in which case the input data would be in the form of radar range data. Another potential use for the inventive filter is in image processing, in which case the input would be an image and the filter might be set as a median filter.

The second input 3 is for a single bit indicator signal which accompanies input of the first word of a new set of data. In the exemplary arrangement, the single bit indicator input is set to high when the first word of a new set of data is input, and then returned to low when the second word is input.

The third input 4 is for a last input indicator signal which indicates that the final word in a data set has been input. It is set to high when the final word in a data set is input into the PROF, and may be reset to low at any time before the next data set is received and the first output indicator is set to high.

The fourth input 5 is for a window parameter value input signal which permits the user or host system of the filter to set the window size. In the illustrated preferred embodiment of the invention, the PROF computes window size internally based upon the input window parameter value. Alternatively, the input can be arranged to directly receive the window size, and to have the PROF internally compute the value of the window parameter. The respective functions of the window size and window parameter signals are explained in greater detail below.

The fifth and final input 6 is for a target rank input signal. It is this input that makes the PROF truly programmable, permitting use of the filter as an nth rank filter, special cases of which include a minimum, maximum, or median filter, as will also be explained in more detail below. Essentially, the preferred PROF operates by ranking the largest word as the number one ranked word, while the smallest word is at most the m ranked word (where m is the number of words in the RAM/FIFO-1). Thus, the preferred PROF can be used as a minimum filter by setting the target rank input signal to the window size value $2wp+1$, where wp is the window parameter value. By setting the target rank input signal to 1, the PROF can be used as a maximum filter. In order to create a median filter, the target rank input signal need only be set to $wp+1$.

The PROF has only two outputs, one of which is for the filtered data 6 and the other of which is for an output valid indicator signal 8. The filtered data 7 is to be ignored when the output valid signal is low. As the first filtered word reaches the output, the output valid indicator signal switches to high, after which one word of filter data emerges every clock cycle until each input word has a valid output counterpart and the output valid signal is returned to low.

Figure 2:
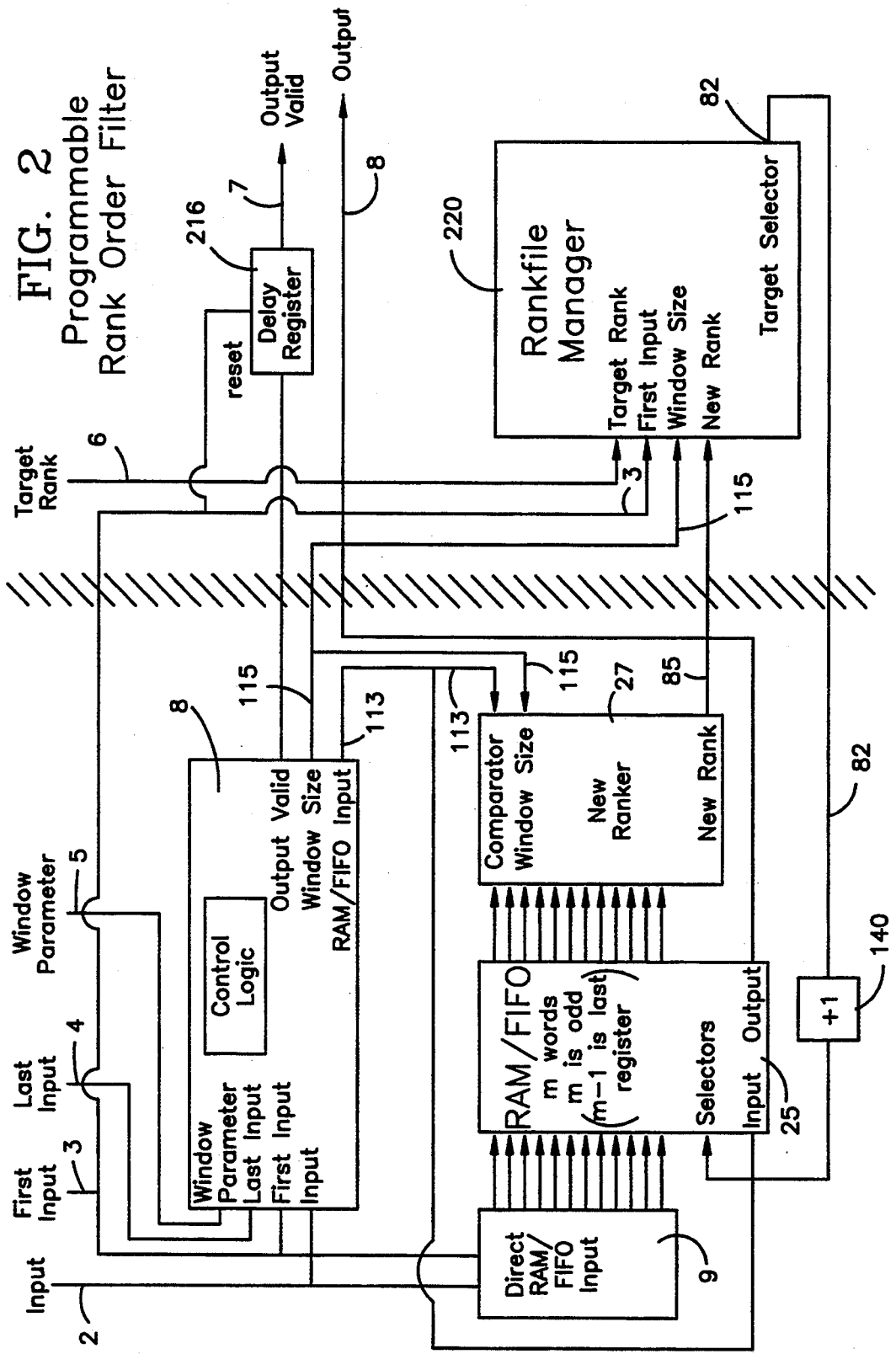
FIG. 2 is a block diagram showing the various functional elements of the PROF of FIG. 1.
Figure 3:
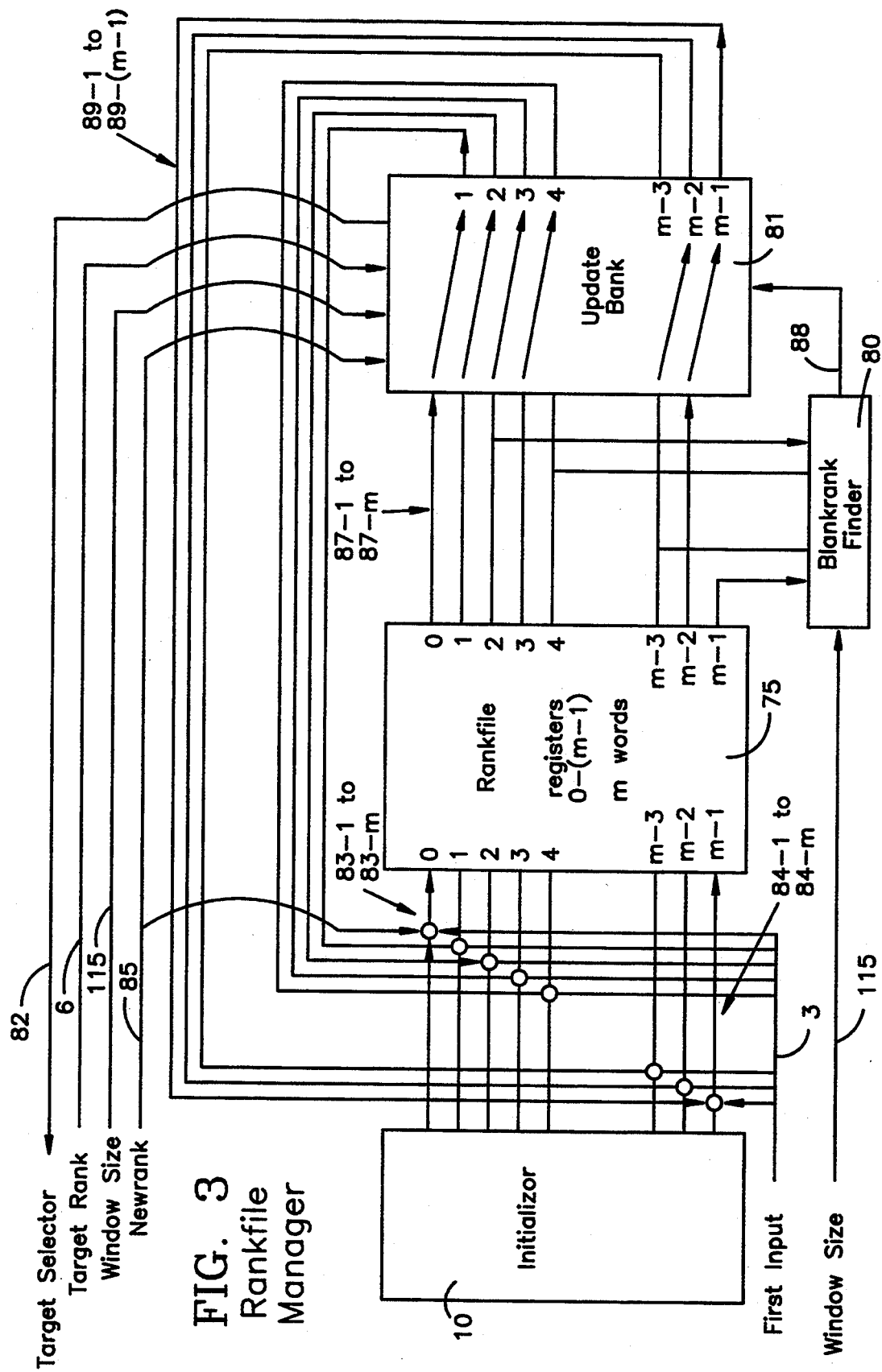
FIG. 3 is a detailed circuit diagram of the rank file manager shown in FIG. 2.
Figure 4:
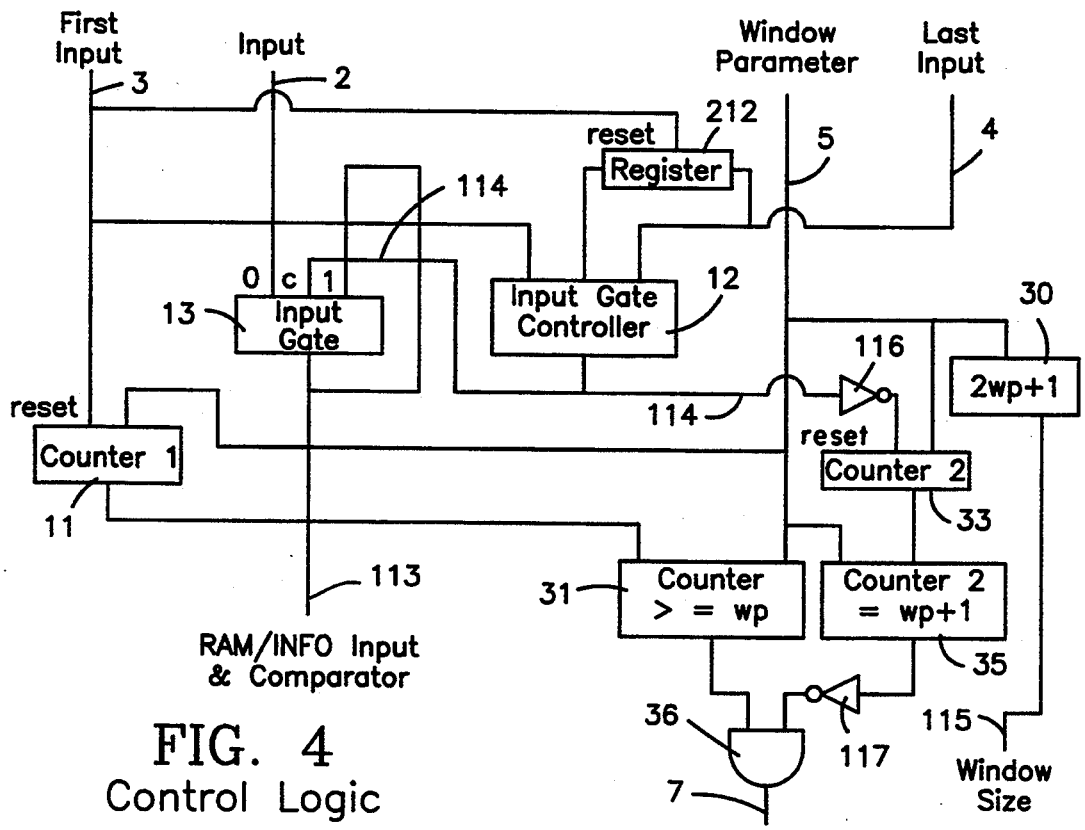
FIG. 4 is a circuit diagram of the control logic element shown in FIG. 2.

As shown in FIG. 2, input 3 for receiving the first input valid indicator signal is connected to a control logic circuit 8 (details of which are shown in FIG. 4), a direct RAM/FIFO input circuit 9 (details of which are shown in FIG. 7), and 2-input, 1-output gates 83-1 to 83-m (details of which are shown in FIG. 13). Data input: 2, on the other hand, is connected only to the control logic circuit 8 and the direct RAM/FIFO input 9. FIG. 2 also shows a rankfile manager 220 which includes, as shown in FIG. 3, an initiator 10, rankfile 75, blankrank finder 80, and update bank 81 the initiator 10, blankrank finder 80, and update bank 81, being respectively illustrated in more detail in FIGS. 9a, 10, and 11, all of which will be described in more detail below.

As shown in FIG. 4, which is a diagram of control logic circuit 8, input 3 is preferably connected to the reset terminal of a counter 11 (counter 11 including a counter 210 which counts clock pulses when logic gate 111 is enabled by the counter output/window size comparator 112) and to an input gate controller 12. Input gate controller 12 is also connected to last input indicator 4 and register 212 which holds the previous last input indicator and is not updated until after the new state of input gate controller 12 has been determined. Counter 11 counts clock pulses until the count reaches the window size, described in more detail below in connection with the window function, but is held reset to 0 while the first input indicator is high and the first word of data is being input.

The truth table for the input gate controller 12 is illustrated in FIG. 6. When the first input indicator signal is low and the previous last input indicator signal is low, the gate controller output always remains as it previously was, regardless of the state of the last input. However, when the first input indicator signal is high, and the last input indicator signal is low, the gate controller output is always low, regardless of its previous state or the previous last input. When the last input indicator is first set to high, the gate continues to output a low signal. When the previous last input signal goes to high, with the last input signal either remaining high or returning to low, the gate switches to outputting a high signal.

Thus, while the first word of data is received, the input gate controller 12 output will always be low. The low output from input gate controller 12 causes input gate 13 to pass the data input directly from input 112 to output 113 of logic circuit 8. When the high first input indicator signal returns to low, controller 12 stays low. The only times that input gate controller 12 outputs a high signal which causes the input gate 13 to recirculate the most recently passed word are: a) at least one clock cycle after the last input indicator goes to high and b) when the first input indicator signal is low and the gate controller's previous state is high. Therefore, if the last input indicator signal returns to low before the first input indicator signal goes to high, the gate controller outputs a high signal which causes the input gate to continue recirculating the data. If the last input indicator signal remains high while the first input indicator signal returns to high, the gate controller output goes to low and data is passed again.

It would probably be best implement input gate controller 12 with a PROM, although any other implementation producing the truth table in FIG. 6 (or a similar truth table with differences in the rows corresponding to the first and last input indicator equal to 1, which would change the operation of the PROF but not the overall design characteristics) are acceptable. All methods of achieving such equivalent input gate controller circuits are intended to be included within the scope of the invention.

As shown in FIG. 2, input gate 13 passes data directly into the first memory register (register 0) of RAM/FIFO 25 via output 113. Register 0 is the working register of RAM/FIFO 25. The input data is also input directly into the RAM/FIFO through direct RAM/FIFO input 9, shown in FIG. 7 and described below, which fills memory registers 0 through m-1. Output 113 is connected to new ranker 27, which outputs a new rank, as will also be described in more detail below in connection with FIG. 8, at the completion of a first clock cycle.

In addition to providing output 113, control logic circuit 8 calculates a window size by multiplying the window parameter by 2 and adding 1, via circuit 30, and outputting the window size to new ranker 27, blank rank finder 80 and update bank 81 via output 115. Circuit 8 uses the window parameter to determine the state of the output valid signal 7 as follows: Initially, when the first word is input, counter 11 is reset to zero. As subsequent data words are received, counter 11 outputs the count to comparator 31, which compares the count with the window parameter and outputs a high signal when the count reaches the window parameter. Counter 33, on the other hand, which is identical to counter 11 except that it is connected via inverter 116 to output 114 of gate controller 12, remains at its reset value of zero while input gate controller 12 output 114 is low and input gate 13 is passing data from data input 2. Comparator 35 disables the output valid gate 36 whenever counter 2 equals the window parameter plus 1. However, when counter 33 does not equal the window parameter plus 1, i.e., when input gate controller 12 is low, then the output valid signal is high so long as the first input indicator is low and the number of clock pulses or words input is at least equal to the window size.

Figure 5:
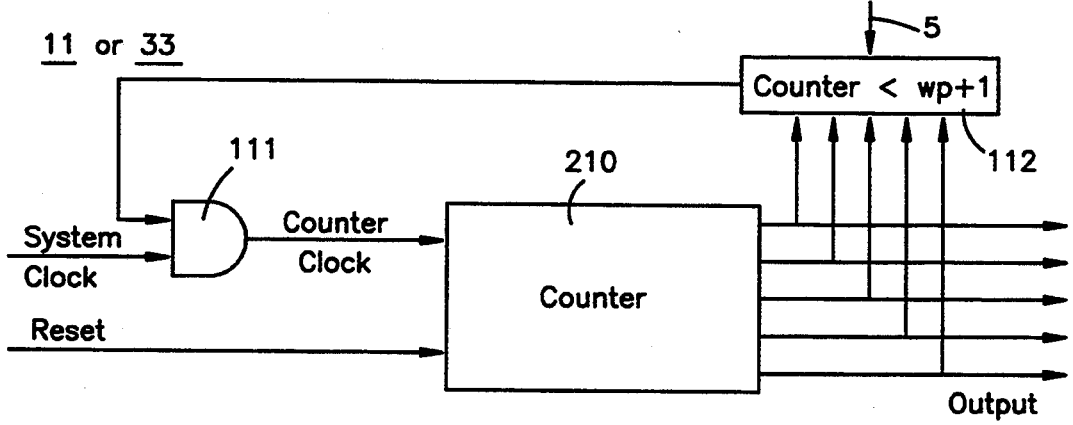
FIG. 5 is a circuit diagram of a counter for use in the control logic element of FIG. 4.

The structure of counters 11 and 33 is shown in more detail in FIG. 5. Each counter includes a circuit 112 for calculating the window size based on the window parameter and comparing the current count with the window size. When the current count is greater than or equal to the window size, circuit 112 outputs a low signal which disables AND gate 111, preventing the clock signals from passing to counter circuit 210. The counter circuit 210 increments on the system clock as long as the count is less than the window size+1.

The direct RAM/FIFO input 9 consists of two input-/one output gates 50-0 to 50-(m-2), as shown in FIG. 7, controlled respectively by the first input indicator signal input through input 3. Gates 50-0 to 50-(m-2) are shown in greater detail in FIG. 13, in which first input 3 is shown as being connected to the control input, external data input 2 to input 1, and an internal RAM/FIFO input to input 0 for the purpose of recirculating data when the first input indicator 3 is low.

As shown in FIG. 13, control of each two input/one output gate is via AND gates 51-58 and 61-68, one input of each of which is connected to the control input and the other to the individual lines which carry the respective bits of the eight-bit data words. An appropriate arrangement of OR gates 70, for outputting the eight-bit words, is shown symbolically by a stack of OR gates. The output, in this case, goes directly to the registers 0-(m-2) of the RAM/FIFO. An inverter 71 causes either input 1 or input 0 to be passed to the OR gates, depending on the state of the control signal. The data is passed from input 1 until the control signal changes to low, which, in the case of gates 50-0 to 50-(m-2), is indicative of completion of the first word, at which time the data originally input through input 1, and output back to input 0, is passed to the corresponding RAM/-FIFO memory registers 0 to (m-2).

New ranker 27 compares the first data word output by output 113 of logic circuit 8 with each of the words present in registers 0 to m-2 using respective difference circuits 40-0 to 40-m-2, as shown in FIG. 13. The new rank is the number of registers of RAM/FIFO 25 whose contents are larger than the first data word, designated in FIG. 8 as the "comparator", plus one. Gates 41-0 to 41-(m-2) output a count when the contents of the corresponding register are greater than the comparator, i.e., when the difference is greater than zero. The counts are summed by adders 42-1 to 42-(m-1) to obtain the new rank. Finally, the window size is input to a plurality of comparators 43-3 to 43-(m-2), which disable the output from gates 44-3 to 44-(m-2) if the window size is less than the corresponding register number, thereby preventing these registers from affecting the new rank. Connected to the first adder 42-1 is a high signal source, so that the largest value is ranked one instead of zero. All but the last two registers m-2 and m-1 of the RAM/FIFO 25 are hardwired into the new ranker 27.

By the end of the first clock cycle, new ranker 27 has completed a ranking sequence and outputs a new rank. The RAM/FIFO 25 is popped so that the new date word is stored in register 0. With the beginning of a second clock cycle, the high first input indicator signal triggers an initializer 10 to load a rank file 75 with sequential ranks. Rank file 75 contains the current rank of the words in corresponding registers 0 to (m-1) of the RAM/FIFO 25. During the remainder of the clock cycle, the blank rank is found by the blank rank finder 80, the rank file values are passed through the update bank 81 and the target ranked value is sent to the output 82. However, as long as the first input indicator is high, the rank file registers are held at their initialized values by initializer 10 and any output is invalid.

Figure 9A:
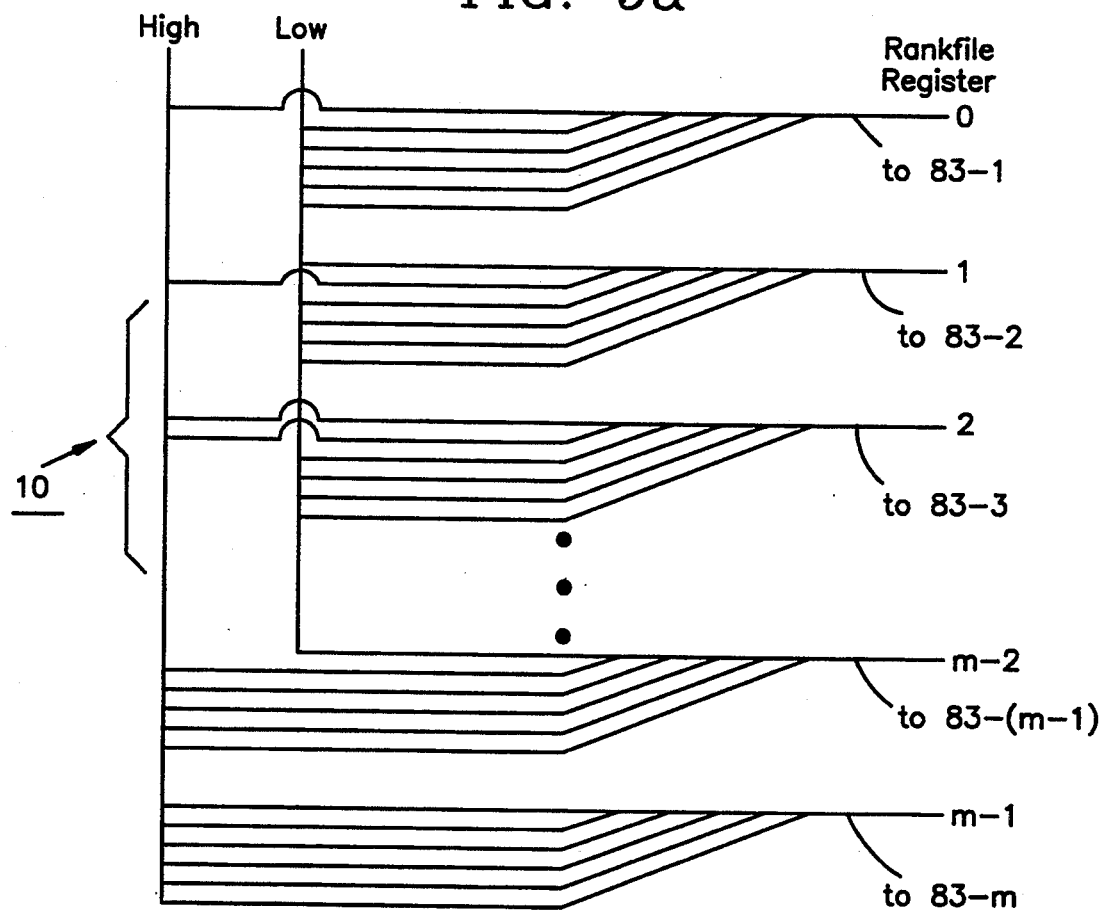
FIGS. 9A is a schematic diagram illustrating the manner of operation of the initializer shown in FIG. 2.
Figure 9B:
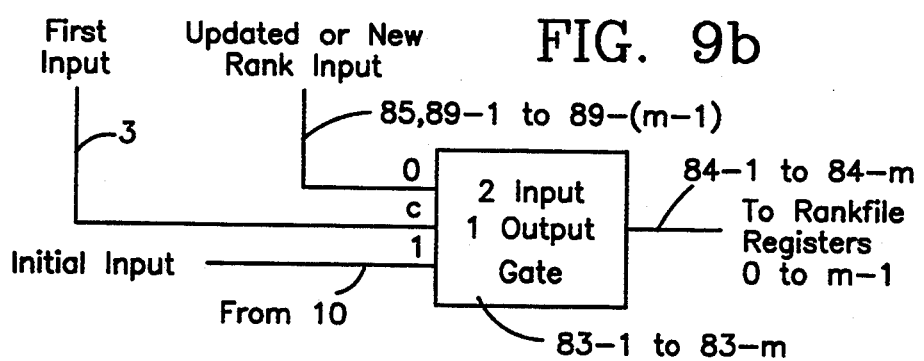
FIG. 9B shows the junction which determines whether the values from the initializer or the update bank are to be passed into the rank file.

Initializer 10 is shown in FIG. 9a. The initializer outputs are connected to a plurality of two input/one output gates 83-1 to 83-m, one of which is shown in FIG. 9b, wired to receive input signals from the initializer or the update bank, via nets 89-1 to 89-(m-1). The initializer provides an initial rank whenever the first input signal is high by, for example, connecting the respective bits of the initial input to a high or a low signal source as shown in FIG. 9a. Outputs 84-1 to 84-m are hard wired to the corresponding registers 0 to m-1 of rankfile FIFO 75. Two input/one output gate 83-1 connects either a one from the initializer or the new rank from new ranker output 85 to rankfile register 0.

Figure 10:
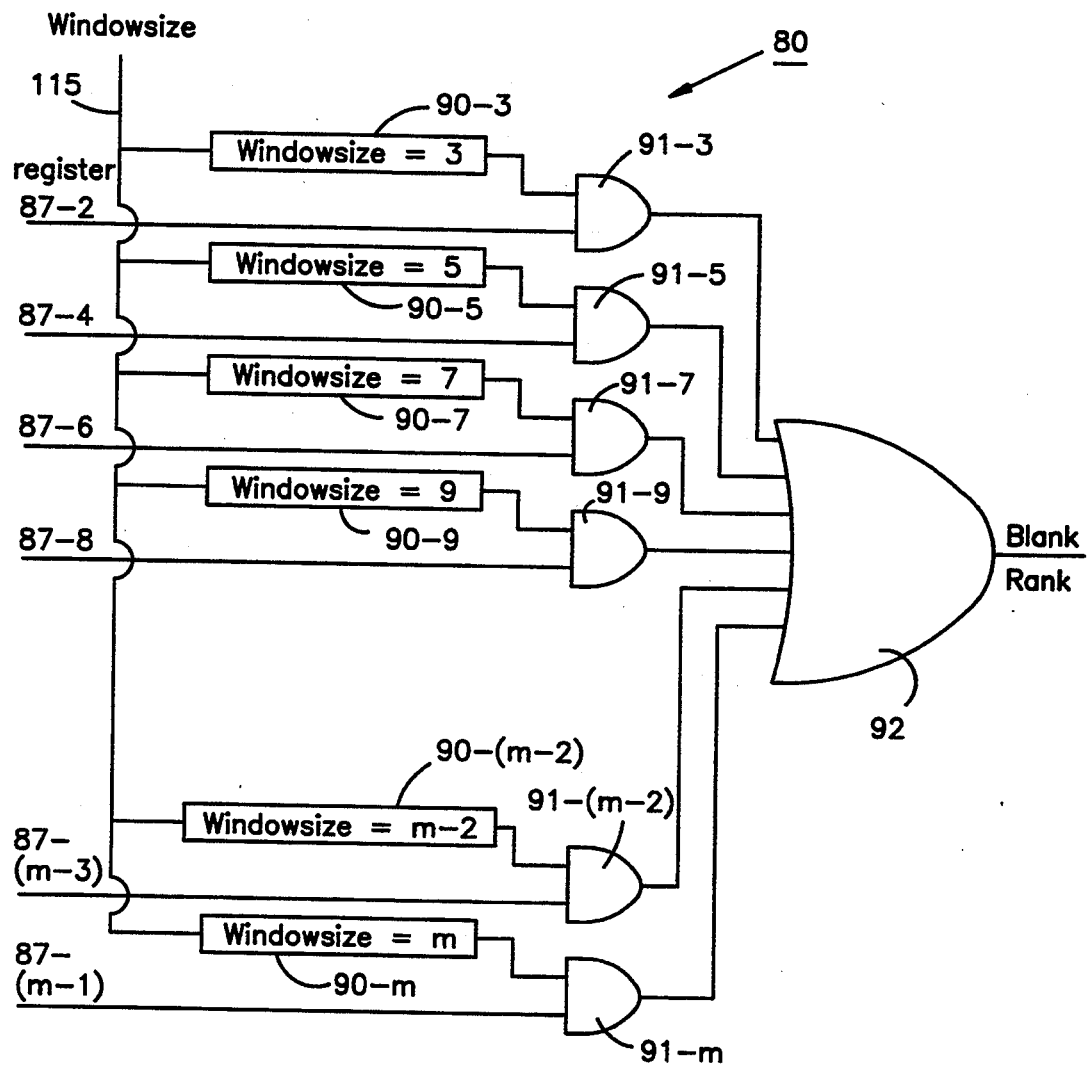
FIG. 10 is a logic diagram of the blank rank finder shown in FIG. 2.

The outputs of all even registers, not including the zero register, are hard wired into the blank rank finder 80, shown in FIG. 10. Blank rank finder 80 locates the new rank located in the respective register corresponding to the window size as determined by circuits 90-3 to 90-(m). Only the circuit corresponding to the window size outputs a high signal to enable a corresponding AND gate 91-3 to 91-(m). Since only the blank rank is allowed to pass the enabled AND gate 91-3 to 91-(m), an arrangement of OR gates represented by gate 92 are used to combine the outputs into the single blank rank output 88 to update bank 81.

Both the blank rank and the new rank are passed through the update bank 81. FIG. 11 shows the circuitry that is repeated (m-1) times to make up the update bank 81. Update bank 81 is wired to rank file registers 1 through m-1 via multiplexers 83-1 to 83-m and includes inputs from the target rank input 6, blank rank output 88, and new rank output 85. Update bank 81 updates the ranking so that the first window size ranks in the rank file correspond with the values in the same register of the RAM/FIFO. FIG. 12 illustrates the manner in which the rank file is updated by removing the blank rank from a register of the update bank, shifting the ranks located between the blank rank and the new rank, inclusive of the new rank, adding a new updated new rank, and respectively adding or subtracting depending on whether the blank rank was greater than or less than the new rank.

Update bank 81 includes five comparators for the five possible input situations. Comparator 115 outputs a high signal if the blank rank is greater than the new rank. Comparator 116 outputs a high signal if the, rank in register X of the rank file is greater than or equal to the new rank, while comparator 117 outputs a high signal if the rank is less than the blank rank, and AND gate 118 outputs a high signal if the rank is greater than or equal to the new rank and the blank rank. Similarly, comparator 119 outputs a high signal if the rank is less than the new rank and comparator 120 outputs a high signal if the rank is greater than the blank rank, whereupon AND gate 1 21 outputs a high signal if the rank is greater than the blank rank and less than or equal to the new rank. If gate 118 and comparator 115 output high signals, gate 122 will output a high signal. If gate 121 outputs a high signal and comparator 115 outputs a low signal, then inverter 124 will cause gate 123 to output a high signal. Respective incrementing or decrementing circuits 125 and 126 then shift the rank to enable gates 127 and 128 to pass the eight-bit shifted rank via gate 109 to form the input 1 of a two input/one output gate 110 which can be implemented as shown in FIG. 13.

The initial rank from the rank file register forms the input 0, while the control is connected to the output of OR gate 129 which indicates the presence of a high signal from either gates 122 or 123. Gate 129 will output a high signal if the inputted rank should be updated. The output from gate 110 is the update rank which is then stored back in the rank file via outputs 89-1 to 89-(m-1).

Besides updating the rank file ranks, the update bank also picks up the location of the word which has the rank specified by the target rank. When the updated rank is equal to the target rank as determined by comparator 130, and still within the window determined by comparator 131, AND gate 132 causes the number of the register corresponding to the target rank to be passed by AND gate 133 to the output location terminal 82. Since only one of the ranks will produce an output other than zero, an arrangement of OR gates, represented by reference numeral 214, combines the outputs into a single output 82. This output is the target selector that is passed back to the RAM/FIFO 25 and identifies the register that contains the targeted output. Should the targeted rank be the new rank, the OR gate arrangement will make the target selector equal to zero as desired. Therefore, it is not necessary to have additional circuitry for the new rank.

A one must be added to the target selector for terminal 82 to RAM/FIFO 25 by adder circuit 140 because the RAM/FIFO has shifted down one memory location. The output from adder circuit 140 is used as the output selector for the RAM/FIFO. The output from the RAM/FIFO is the PROF output.

As is apparent from the above description, the preferred PROF can be described as having a pipelined architecture so that during the second clock cycle, while the first word is processed by the rankfile 75 and the Update Bank 81, the second word of data is being processed by the RAM/FIFO 25 and new ranker 27.

As the second word is input, the first input indicator signal is set to low to allow counter 11 to increment each clock cycle. The input gate controller 12 continues to output a low signal because the last input indicator signal continues to be low, and therefore words are passed through the input gate 13 unobstructed. Comparator 31 also remains at zero until counter 11 equals the window parameter wp. Exactly wp+1 clock cycles after the first word was input, the output valid signal goes to high. Because of delay register 216, which is clocked at the same time the RAM/FIFO outputs the targeted data word, the output valid signal reaches the PROF output one clock cycle later. The RAM/FIFO 25 is then popped so that register 0 through the register corresponding to the window size minus 1 contain the current values within the window.

This process repeats each clock cycle until the last input indicator is set to high. At this point, the input gate controller 12 outputs one final low signal, allowing the final data word to pass into the RAM/FIFO 25. From this point until the first input indicator returns to high, the input gate controller outputs a high signal. This recirculates the final data word until the filter pass is completed and the output becomes invalid.

Having thus described in detail a single preferred embodiment of the invention, it should nevertheless be appreciated that the illustrated embodiment is intended to be exemplary, and that the functional elements of the invention may be implemented in numerous ways using equivalent structures. Therefore, it is intended that the invention not be limited to the described embodiment, but that it be defined solely by the appended claims.

We claim:

1. In a rank order filter, including:

input means for inputting a sequential data set which includes a plurality of words, where n is a number of word in the sequential data set;

filtering means for performing rank order filtering relative to a target rank on values of said words which are within a window having a predetermined window size; and output means including a filtered data output for outputting from said filter a rank order filtered output data set based on said target rank, the improvement comprising:

means including a target rank input for selectively inputting into said filter a target rank signal indicative of said target rank;

means for inputting into said filter a window parameter; and means for determining from said window parameter said window size, whereby both the target rank and the window size can be varied to select one of a medium filter, low pass filter and high pass filter for different values of the target rank, and wherein said filtering means comprises;

RAM/FIFO means connected to said input means for storing said sequential data set, said sequential data set being made up of m words of data numbered sequentially from 0 to m-1;

a new ranker connected to said RAM/FIFO means which ranks said words of data by comparing a first word of said data with the remaining words of said data to determine the rank of said first word on a first clock cycle and for comparing a second word with the remaining words to obtain a new rank for the second word;

a rankfile manager which includes an update bank, a blankrank finder, rankfile FIFO means and output means connected to said RAM/FIFO means for supplying a target selector to said RAM/FIFO means, said target selector identifying a register of the RAM/FIFO means which contains a targeted output and causing said RAM/FIFO means to output the word of data contained in said identified register as a word of said rank order filtered data output set via said output means, said rankfile FIFO means having outputs connected to inputs of the update bank and inputs connected to outputs of the update bank for respectively receiving from said update bank current ranks of the words stored in said RAM/FIFO means and for subsequentially sending said current words back to the update bank for updating, said blankrank finder being connected to said window size determining means and to said outputs of the rankfile FIFO means for locating a rank stored in said rankfile FIFO means which corresponds to said window size (hereinafter referred to as the blankrank), and said update bank being connected to said target rank input, said window size determining means, and said new ranker for comparing the ranks stored in the rankfile FIFO means with new ranks supplied by the new ranker, and updating the ranks stored in the rankfile FIFO means by:

removing the blankrank from a register of the update bank, shifting the ranks located between the blankrank and the new rank, inclusive of the new rank, adding a new updated new rank from the new ranker, and respectively adding or subtracting to or from the stored rank depending on whether the blankrank was greater than or less than the new rank.

2. A rank order filter as claimed in claim 1, further comprising first input indicator means for inputting a single bit indicator signal which accompanies an input of a first word of said sequential data set and last input indicator means for inputting a second single bit indicator signal which indicates that a final word in said sequential data set has been input, and wherein said filter further comprises a control logic circuit including input gate means for passing data to said RAM/FIFO means in response said single bit indicator signals.

3. A rank order filter as claimed in claim 2, wherein said input means comprises an input gate controller means for causing said input gate to selectively input data based on states of said first and last input indicator signals such that the input gate is controlled to pass said sequential data set to said RAM/FIFO input means in response to said first and last input indicator signals.

4. A rank order filter as claimed in claim 1, further comprising means for counting clock cycles and outputting an output valid signal after a number of clock cycles has elapsed following input of said first word to thereby define said window, said number of clock cycles equalling said window parameter plus one.

5. A rank order filter as claimed in claim 1, wherein said RAM/FIFO means comprises a working register and a plurality of memory registers numbered from 1 to m-2, and wherein said new ranker includes means for determining the new rank by calculating a number of registers whose contents are larger than a first word of said sequential data set.

6. A rank order filter as claimed in claim 5, wherein said new ranker comprises a plurality of comparators numbered from 3 to m-2, each comparator having one input hard wired to respective ones of said memory registers and a second input connected directly to said input means.

7. A rank order filter as claimed in claim 6, further comprising means for inputting said window size to said new ranker; and means for disabling an output of a corresponding one of said comparators if the window size is less than a corresponding register number.

8. A rank order filter as claimed in claim 1, further comprising means for sequentially loading new ranks into the rank file FIFO a first clock cycle after said first word has been input, the rank file FIFO containing a current rank of the words in corresponding register zero to m-2 of said RAM/FIFO, said update bank means including means for updating said ranking so that a number of new ranks within said window size in the rank file FIFO correspond with values in a corresponding one of the RAM/FIFO registers.

9. A rank order filter as claimed in claim 8, wherein said update bank is hard wired to rank file registers 1 to m-2.

* * * * *